(12) United States Patent
Frederick (10) Patent No.: US 8,051,400 B2
(45) Date of Patent: Nov. 1, 2011

(54) MODIFYING INTEGRATED CIRCUIT LAYOUT

(75) Inventor: Marlin Wayne Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 468 days.

(21) Appl. No.: 12/289,159

(22) Filed: Oct. 21, 2008

(65) Prior Publication Data

US 2010/0100861 A1     Apr. 22, 2010

(51) Int. Cl.
*G06F 17/50* (2006.01)
(52) U.S. Cl. ......... 716/119; 716/118; 716/122; 716/125
(58) Field of Classification Search .................. 716/118, 716/119, 122, 125
See application file for complete search history.

(56) References Cited

U.S. PATENT DOCUMENTS

| | | | | |
|---|---|---|---|---|
| 5,225,991 A * | 7/1993 | Dougherty | ..................... | 716/123 |
| 5,416,720 A * | 5/1995 | Fukui | ............................ | 716/123 |
| 5,623,420 A * | 4/1997 | Yee et al. | ....................... | 716/120 |
| 5,625,568 A * | 4/1997 | Edwards et al. | ............. | 716/122 |
| 5,671,397 A * | 9/1997 | Crafts | ............................. | 716/54 |
| 5,838,583 A * | 11/1998 | Varadarajan et al. | ......... | 716/123 |
| 5,856,927 A * | 1/1999 | Greidinger et al. | ........... | 716/122 |
| 6,054,872 A * | 4/2000 | Fudanuki et al. | ............... | 326/39 |
| 6,260,177 B1 * | 7/2001 | Lee et al. | ...................... | 716/121 |
| 6,269,466 B1 * | 7/2001 | Crafts | ............................ | 716/113 |
| 6,536,028 B1 * | 3/2003 | Katsioulas et al. | ........... | 716/125 |
| 6,567,967 B2 * | 5/2003 | Greidinger et al. | ........... | 716/108 |
| 6,814,296 B2 * | 11/2004 | Angle et al. | .................. | 235/492 |
| 7,343,570 B2 * | 3/2008 | Bowers et al. | ................ | 716/121 |
| 7,908,571 B2 * | 3/2011 | Bowers et al. | ................ | 716/132 |

* cited by examiner

*Primary Examiner* — Sun Lin
(74) *Attorney, Agent, or Firm* — Nixon & Vanderhye P.C.

(57) ABSTRACT

A layout for an integrated circuit includes standard cells positioned at standard cell sites. Programmable cells are positioned at programmable fill sites which have a size sufficient to accommodate the programmable cells and are not occupied by standard cells. The position of these programmable sites is recorded in site data as part of the layout data associated with the layout. Empty standard cell sites remaining after standard cells and programmable cells have been placed are filled with standard fill cells. The boundaries of the programmable cells are not constrained other than by alignment with standard cell sites. This permits a high density of programmable fill sites and programmable cells to be achieved. When it is desired to replace a programmable cell with a programmed cell the programmable cells are all deleted from the layout and then the required programmed cells are subject to an automated placement algorithm to place them where appropriate for their function. The remaining empty programmable fill sites are then refilled with programmable cells. Finally, routing algorithms to connect to and from the newly introduced programmed cells are executed to connect those program cells up to the other points within the integrated circuit layout required.

17 Claims, 6 Drawing Sheets

MODIFYING INTEGRATED CIRCUIT LAYOUT

BACKGROUND OF THE INVENTION

1. Field of the Invention

This invention relates to the field of integrated circuits. More particularly, this invention relates to modifying the layout of an integrated circuit after it has initially been formed in order to, for example, fix bugs or performance difficulties which have only become apparent after the layout was initially formed.

The set up costs for manufacturing an integrated circuit are high. As integrated circuits increase in complexity and density, the masks and other materials necessary to manufacture those integrated circuits also increase in cost. Accordingly, if when an integrated circuit has been manufactured and is tested it is determined that there is a problem with its design, such as a bug, performance limitation or missing piece of functionality, then it is disadvantageously expensive to remake all of the masks and other materials necessary to manufacture the integrated circuit in order to fix the problem.

2. Description of the Prior Art

One known way of dealing with this issue is to provide within the integrated circuit what are termed "spare gates" which are positioned throughout the integrated circuit and which may be connected via a suitable modification to the routing layers in order to replace functionality which is flawed elsewhere or provided new functionality that may be necessary. A problem with this approach is that such spare gates tend to be disadvantageously large and are often not located close to the portion of the integrated circuit in which the problem has arisen. This results in long signal routing paths being necessary, which itself presents a performance limitation. Furthermore, with the increasing complexity of integrated circuits the ability to achieve such routing becomes increasingly difficult as many layers of the integrated circuit may need to be traversed. The spare gates even though large are sometimes inadequate to provide the functionality required to fix a problem.

Another approach which has been used recognises that when the standard cells forming an integrated circuit have been placed into position, typically by the automated synthesis tools, there exist many unused sites between the standard cells. These unused sites may be filled with simple fill cells (e.g. that provide additional decoupling capacitance). Another possibility is to fill these unused sites with programmable cells which are not at first instance used but which have the capability to be brought into use and connected to standard cells or other portions of the integrated circuit by modifying only a relatively few layers within the integrated circuit. Thus, the changes in the masks necessary to use these programmable cells, i.e. turn them into programmed cells, can be limited to only a small number of the total number of masks and accordingly the cost of making such a change may be reduced. As an example, a programmable cell may include the diffusion layers and gate layers necessary to provide transistors for use in forming logical elements, but may not include any metal layers for connecting up and rendering those gates operational or configuring them to provide a particular logical function. The programming of such programmable cells may be to provide an appropriate metal layer over the underlying diffusion and gate layers to connect up the gates in a desired manner. Such programming of the programmable cells yields programmed cells and may involve the modification of only one metal layer (and/or the contact layer) within the plurality of layers which make up the integrated circuit, each of these layers having an associated mask. In practice it may also be necessary to add routing connections in other layers in order to connect the programmed cells up to other points within the integrated circuit. Nevertheless, the number of masks needing to be modified can be reduced compared to producing a complete new design to solve a problem.

In order to obtain good use of this technique it is important that there are sufficient programmable cells in the locality of the bug which occurs or the locality where the additional functionality is required. If insufficient programmable cells are available, then it may not be possible to fix the bug or the fix may be inefficient due to excessive routing delays. Accordingly, it is advantageous to provide a large number of programmable cells into the spaces which are not used by the standard cells.

One approach to providing programmable cells within the design is to place the standard cells as required using the normal synthesis, place and route tools and then search through the layout to identify any placement sites large enough to accommodate a programmable cell and place a programmable cell at each of these sites. Remaining empty sites can be filled with standard fill cells. In use, the designer wishing to convert a position within the integrated circuit currently occupied by a programmable cell into a programmed cell for fixing a problem must manually identify a suitable programmable cell located near the problem to be solved, manually remove that programmable cell from the layout, fill the now empty space with a suitably selected programmed cell (e.g. selected from a library of programmed cells having appropriate metal layers to achieve the desired functionality) and then can automatically generate routing to connect that programmed cell to the desired point or points within the remainder of the integrated circuit. A problem with this approach is that there is considerable scope for further errors to be introduced in the placement choices made by the designer seeking to fix an existing problem.

Another technique is to predefine an array of programmable fill sites overlying the array of standard cell placement sites. When the layout is being formed, the standard cells are placed at appropriate standard cell sites. A search may then be conducted for programmable fill sites which are completely unoccupied by any standard cells or portions of standard cells. Programmable cells are then placed in identified empty programmable fill sites. These programmable cells will have known locations associated with the predefined grid of programmable fill sites. Remaining unused standard cell sites which are not occupied by a standard cell or by a programmable cell are then filled with fill cells.

When it is desired to use some of the programmable cells to address a problem, automated mechanisms may be used by first deleting all of the programmable cells from the layout. These deleted programmable cells will have known locations associated with the programmable fill site grid. The programmed cells needed address the bug can then be identified. Since the empty sites where placement of these program cells is possible are known from the programmable fill site grid, the standard placement algorithms (or slightly modified forms thereof) can be used to automatically place the programmed cells in positions suitable for connection and use with the other portions of the integrated circuit with which it is desired they interact. The automated routing mechanisms may then be used to provide signal routing to those program cells. This capability to provide automated placement and routing using empty sites corresponding to previously placed programmable cells reduces the likelihood of error in the use of the programmed cells to fix a problem which has been identified.

A disadvantage associated with this second approach is that since the programmable fill site grid is predefined and a programmable cell is not placed unless a programmable fill site is completely empty, it tends to provide fewer programmable cells within the initial layout. Thus, fewer programmable cells are available to fix problems which have been identified. Furthermore, the maximum size of blocks of programmable cells tends to be smaller limiting the functionality that can be provided at one location. This reduces the capability of these mechanisms to solve problems which have been identified.

SUMMARY OF THE INVENTION

Viewed from one aspect the present invention provides a method of generating a layout for an integrated circuit, said method comprising the steps of:

providing an array of standard cell sites for placement of standard cells to be used in forming said integrated circuit;

placing standard cells at selected standard cell sites within said array;

searching said array for clusters of adjacent standard cell sites that are not occupied by a standard cell and have a size sufficient to hold a programmable cell, said clusters having boundaries permitted to be at any position within said array and said size corresponding to a plurality of standard cell sites;

identifying said clusters as programmable sites for programmable cells to be used in forming said integrated circuit and placing programmable cells at said programmable sites; and generating layout data characterising said layout, said layout data including site data identifying said programmable sites.

The present technique recognises that after standard cell placement has taken place, a search may be performed to identify empty sites of sufficient size to accommodate a programmable cell without any constraint of how the boundaries of that programmable cell align other than with the array of standard fill locations for the standard cells. This gives a larger number of possibilities for locations where programmable cells may be located and accordingly a higher programmable cell density may be achieved. The technique further seeks to achieve the advantages of more automated use of programmable cells by generating and preserving data identifying the programmable cell sites which have been used even though these are not set out on a regular grid. Preserving this programmable site information even though the programmable cells are not laid down in a regular grid form permits the use of automated placement and automated routing mechanisms when that layout requires modification.

It will be appreciated that the identification of programmable fill sites and the placing of programmable cells could take place with the programmable fill sites first being identified and labelled as such and then subsequently filled with programmable cells. An alternative would be that the suitably sized sites would be identified, filled with the programmable cells and then a subsequent step could post-process the layout to identify and record sites at which programmable cells have been placed and note these as programmable fill sites. Both of these possibilities and other similar possibilities are encompassed by the present techniques.

The standard cell sites not filled with standard cells or programmable cells may be filled with fill cells.

The programmable cells are not normally used in operation of the integrated circuit and are modified to form programmed cells that are used in operation when desired as part of fixing a problem or providing additional functionality.

The programmable cells may be formed of a plurality of circuit layout patterns and a programmed cell will share a plurality of these circuit layer patterns with the programmable cell. This reuse of many of the circuit layer patterns of the programmable cell by the programmed cell leads to a reduction in the cost of forming the programmed cells since the number of masks which need to be modified and other changes made to the manufacturing process are reduced.

In some embodiments it will be common that the programmed cell has one or more metal circuit layers and/or a contact layer that differ from the programmable cell while circuit layers such as the diffusion layer and the gate layers will be common between the programmable cells and the programmed cells.

Viewed from another aspect the present invention provides a method of generating a modified layout of an integrated circuit having standard cells aligned with an array of standard cell sites and programmable cells, said method comprising the steps of:

reading data defining an initial layout of said integrated circuit including site data identifying sites at which programmable cells are located, said programmable cells having a size corresponding to a plurality of standard cell sites and having boundaries permitted to be at any position within said array;

automatically placing one or more programmed cells at respective sites identified by said site data as currently containing a programmable cell; and automatically adding routing connections to couple said one or more programmed cells to one or more standard cells within said integrated circuit.

In this aspect of the invention the integrated circuit layout which has been formed including the programmable cells and data identifying the programmable fill sites may be used to form a modified layout by reading the site data identifying the locations of the programmable cells and then automatically placing one or more programmed cells at those identified locations. The automatic placing is enabled since the site data identifies the placement locations which may be used, i.e. the placement locations that are filled with programmable cells and accordingly have the necessary underlying infrastructure to form programmed cells by the selecting of suitable metal layers or other layers. The automatically placed programmed cells may then be subject to automatic routing to provide routing connections. In this way, error prone manual placement may be avoided since the provision of the site data identifies where the programmable fill cells are located and the flexibility of location of these programmable fill sites provides that the density of programmable cells is advantageously high compared to constraining the programmable cells to be positioned on a predefined programmable cell grid.

The technique of modifying the layout may include, before the automatic placing step, a step of deleting the programmable cells from the layout using the site data to identify these programmable cells thereby providing empty sites into which the programmed cells may be placed using the conventional placement algorithms or slightly modified forms thereof.

Subsequent to the step of automatically placing the programmed cells, a further step may be provided which refills empty sites identified by the site data and not containing a programmed cell with a programmable cell. This restores the layout to a filled condition and ensures those masks remain unchanged because not placing programmable cells back into these sites would result in a change to those layers.

Other aspects of the present invention provide a computer readable medium storing a computer program for controlling a computer to perform a method in accordance with the above described techniques.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
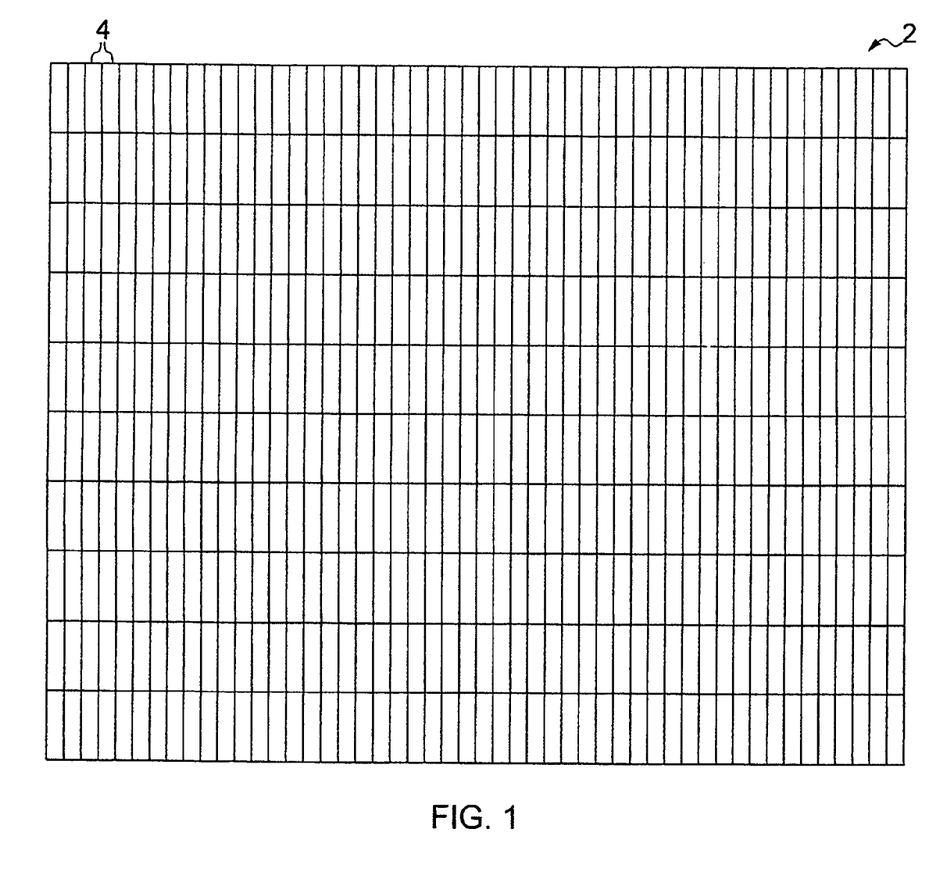
FIG. 1 schematically illustrates an integrated circuit layout showing an empty standard cell site array into which standard cells are to be placed.

FIG. 1 schematically illustrates a starting point in forming a layout for an integrated circuit 2. The area of the integrated circuit is divided into an array of standard cell sites 4 which may be filled with standard cells from a cell library. It will be understood by those in this technical field that the standard cells may occupy multiple standard cell sites. The placement of the standard cells is selected such that they occupy one or more adjacent empty standard cell sites 4. The standard cell sites 4 represent a positional quantization in the placement which may be performed.

Figure 2:
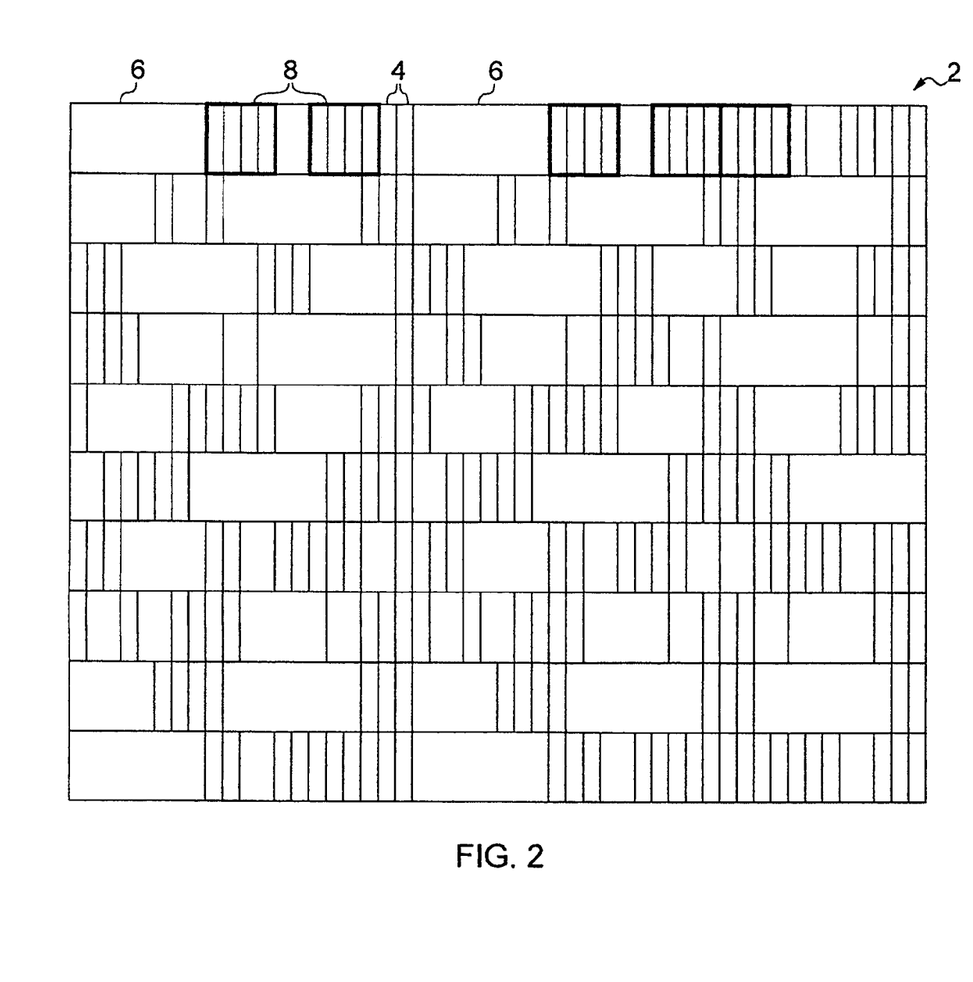
FIG. 2 illustrates the array of FIG. 1 in which standard cells have been placed and partway through the searching of the array to identify clusters of sites into which programmable cells may be placed and those sites recorded as programmable fill sites.

FIG. 2 illustrates the layout of the integrated circuit 2 after the standard cells 6 have been placed at the standard cell sites 4. The standard cells 6 are positioned so as to be proximal to other standard cells 6 with which they must communicate. This helps reduce the routing overhead. The mechanisms and algorithms for performing such standard cell placement will be familiar to those in this technical field. The electronic design automatic (EDA) software tools provided by companies such as Cadence Design Systems, Inc and Synopsis Inc can be used to perform such standard cell placement and subsequent routing operations.

A modification over these standard placement and routing algorithms in accordance with the present technique is illustrated in FIG. 2 by the programmable fill sites 8. These programmable fill sites 8 are identified after the standard cells 6 have been placed. A search may be made through the layout 2 in order to identify clusters (blocks) of adjacent empty standard cell sites 4 which together have a sufficient size to accommodate a programmable cell. In the example illustrated the programmable fill cell size is four standard cell sites and accordingly there must be a minimum of four adjacent standard cell sites in order to provide space a programmable fill site. The boundaries of these programmable fill sites can have any position within the array providing they align to standard cell site boundaries. Thus, whenever a block of empty standard cell sites 4 with a size of four or greater fill sites is identified, this may be allocated as a programmable fill site. The flexibility in placing these programmable fill sites 8 wherever a suitably sized empty space arises permits an advantageous high density of programmable cells to be achieved.

In the example illustrated it will be seen that five programmable fill sites 8 have been identified. The blocks of empty standard sites may contain one or more programmable fill sites 8 and there may be some residual empty space which can then be filled by standard fill cells as opposed to programmable cells.

When a programmable fill site 8 is identified data is generated which identifies the position of that programmable fill site. This site data is useful in the subsequent use of the programmable cells when these are to be transformed into programmed cells.

In the above once the programmable fill sites 8 have been identified then programmable cells may be placed therein and the remainder of the empty standard cell sites filled with standard fill cells.

It is also possible in other embodiments that these may proceed to place programmable cells wherever blocks of empty standard cell sites exist having sufficient size using the standard placement algorithms and then subsequently post-placement analyse the layout to identify the positions at which programmable cells have been placed and note these positions as programmable cell sites within the site data for subsequent use.

Figure 3:
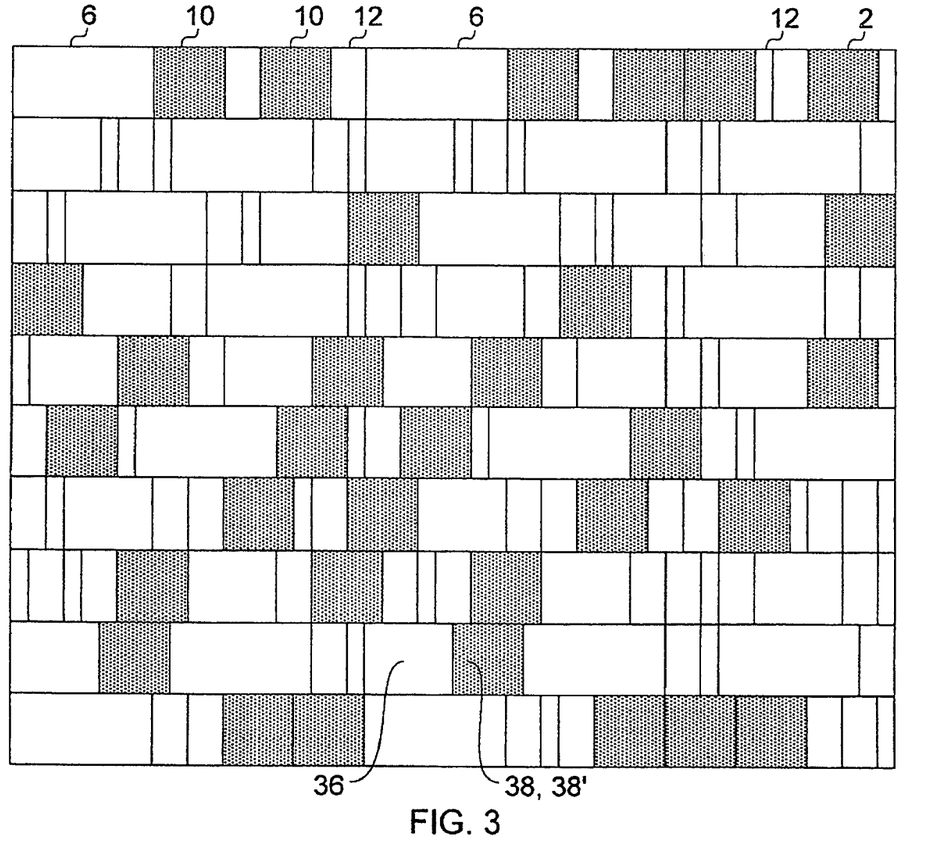
FIG. 3 illustrates the array of FIG. 1 in which all of standard cells, programmable cells and fill cells have been added so as to completely fill the array.

FIG. 3 schematically illustrates the layout 2 in which standard cells 6 have been placed followed by the identification of programmable fill sites and the placement within these programmable fill sites of programmable cells 10. Finally, standard fill cells 12 (such as capacitive decoupling fill cells) are then placed into the remaining empty standard cell sites such that the array of standard cell sites is completely occupied.

The layout illustrated in FIG. 3 has the positioned standard cells 6, the programmable cells 10 and fill sell 12 as well as data identifying the location of the programmable cells 10. In practice many other forms of data may be recorded concerning the layout 2. The layout 2 may then be used to generate masks and other information and elements needed in order to manufacture the integrated circuit corresponding to the layout 2.

Figure 4:
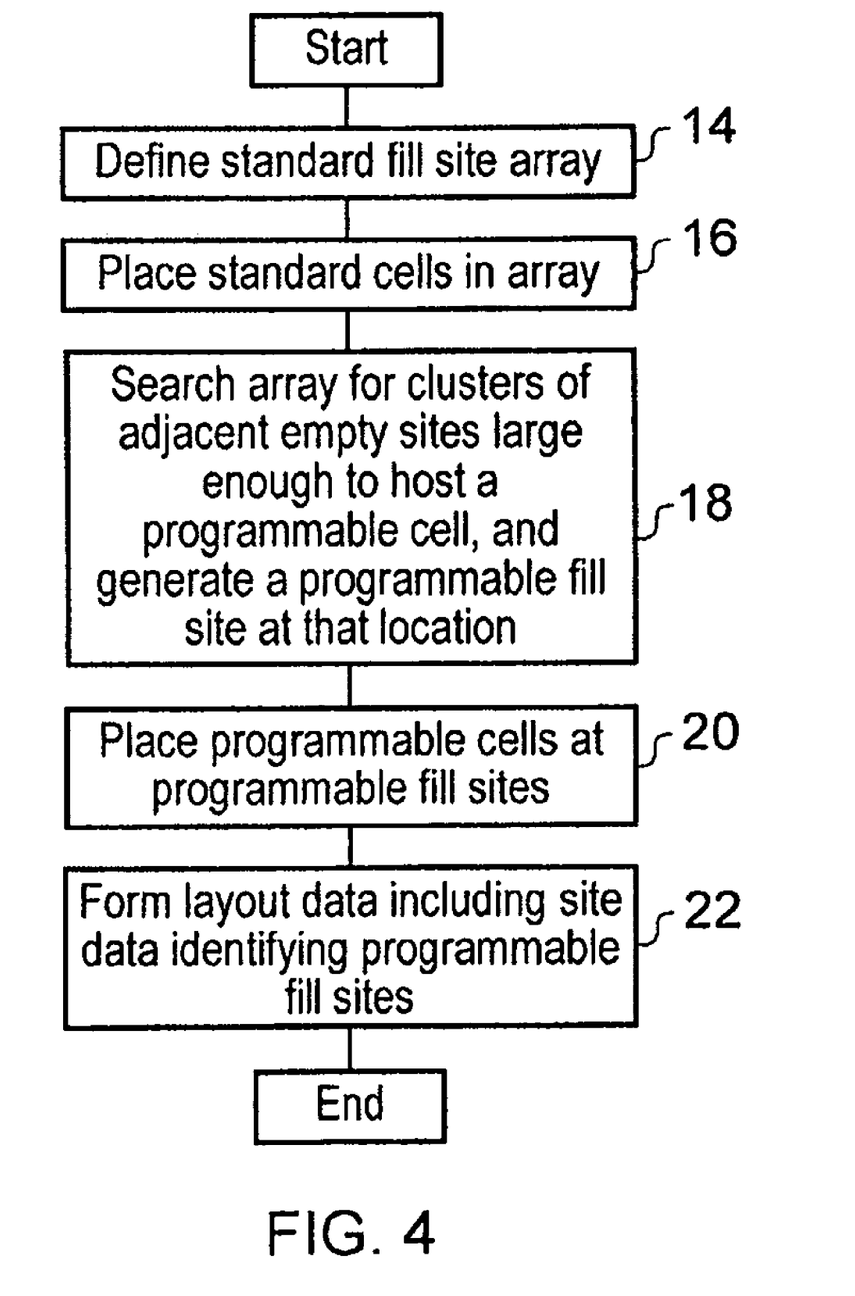
FIG. 4 is a flow diagram schematically illustrating the process of filling the standard cell site array with standard cells and programmable cells as illustrated in FIG. 2.

FIG. 4 is a flow diagram schematically illustrating the way in which programmable cells may be placed. At step 14 the form of the standard cell site array is identified. At step 16 the standard cells are then placed within the array using a normal placement algorithm. At step 18 a search is made for clusters (blocks) of adjacent empty sites large enough to host a programmable cell and then a programmable fill site is generated at that location. The generation of a programmable fill site at the identified location records in the site data the position of that programmable fill site within the array. This site data is kept with the layout and is used when the programmable cells are to be replaced by program cells.

At step 20 programmable cells are placed at all of the programmable fill sites identified at step 18. Remaining empty standard cell sites are then filled with standard fill cells. At step 22 the layout data (data representing the layout of FIG. 3) is formed and this includes site data identifying programmable fill sites as previously discussed.

When an integrated circuit is manufactured in accordance with the layout of FIG. 3 it may be that certain problems are discovered in its operation. It may also be that additional functionality is desired. In this case the programmable cells 10 may be partially replaced with appropriately selected programmed cells. These programmed cells have a large portion of their structure in common with the programmable cells, but typically have one or more metal layers and/or a contact layer selected such that the base underlying configuration of the programmable cell is wired up so as to perform a desired logical function. These programmed cells may not be as compact as a special purpose standard cell(s) having the same function, but they provide the ability to provide circuit elements with a desired function using a modification of relatively few circuit layers (e.g. only metal mask layers) whilst many of the other layers which form the programmable cells can remain unaltered and be reused.

Figure 5:
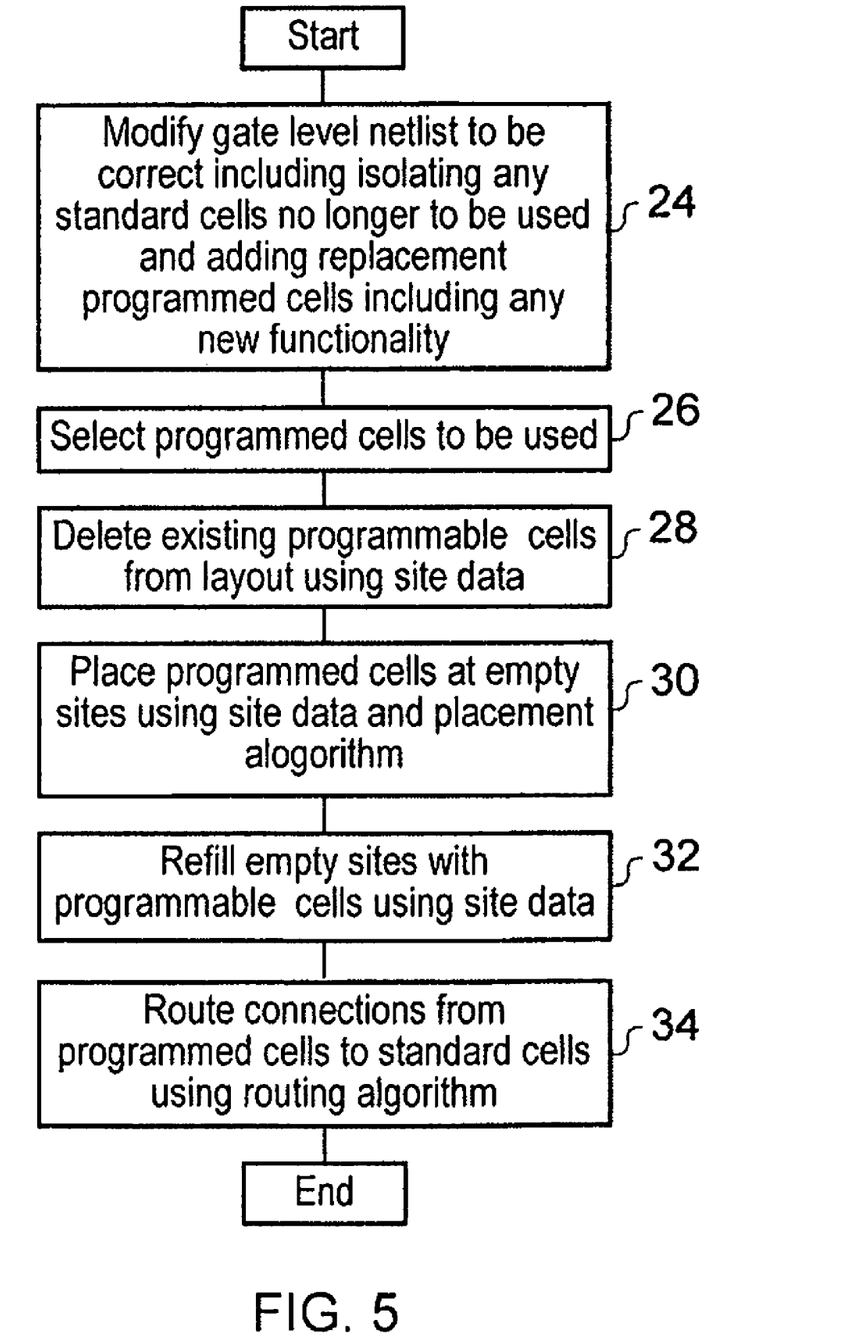
FIG. 5 is a flow diagram schematically illustrating the use of the programmable cells to address a problem or provide new functionality within an integrated circuit utilising site data to identify positions where program cells may be located in place of existing programmable cells.

FIG. 5 illustrates such a process of producing a modified integrated circuit layout. At step 24 a modified gate level netlist is generated so as to correct any errors which have been identified and provide any additional functionality required. The correction of the errors will also include isolating any standard cells which are no longer to be used (e.g. they have the wrong forms). This isolation may include tying off their inputs and outputs by modifying the metal layers for such standard cells so that they do not float and cause further problems. The modified gate level netlist is generated so as to include replacement programmed cells corresponding to any standard cells which have been removed (as appropriate) and corresponding to any new functionality which has been added.

At step 26 the programmed cells corresponding to the new portions of the gate level netlist generated at step 24 are selected from a library of programmed cells. These programmed cells are based upon the programmable cells 8 but typically include specific metal layer connections in order to achieve their desired functionality.

At step 28 the existing programmable cells within the layout 2 of FIG. 3 are deleted from the layout. This deletion is possible since the site data identifying the programmable fill sites has been recorded and even though the programmable fill sites are not on a regular programmable fill site grid the positions of the programmable cells may nevertheless be accurately identified and they may be removed from the layout. This leaves empty spaces within the layout 2 which are of a size corresponding to a programmed cell which can then potentially be placed at that empty site. The integrated circuit previously manufactured in accordance with the previous masks will have had many of the base level structures necessary for the programmed cell already formed even though these are unused within the programmable cell during operation of the integrated circuit. When the programmed cell is placed at such a site, then typically one or more modified metal layers will be provided at that site and the masks for those metal layers will require modification while the remaining masks, such as those that produce the diffusion regions, the gates etc can remain unaltered since the same structures were present within the programmable cells at those sites.

Step 30 places the programmed cells which have been selected for use at empty sites using the site data to identify those empty sites and in accordance with an automated placement algorithm. This automated placement algorithm can be similar to those normally used to place standard cells. Accordingly, this improves the reliability by avoiding the need for manual placement of the programmed cells. Furthermore, the placement algorithm may make better choices of which programmable fill sites are to be used for all of the programmed cells to produce overall shorter routing leading to more efficient operation. At step 32 the empty sites which have not been filled with program cells are refilled with programmable cells using the site data to identify those empty sites. At step 34 routing connections are established from the programmed cells to the standard cells and other portions within the integrated circuit using a standard or modified routing algorithm. Again the use of an automated routing algorithm reduces the chances of error in this process and may allow more efficient routing to be achieved.

Returning to FIG. 3, it may be that when an integrated circuit has been manufactured it is determined that the standard cell 36 contains an error. Accordingly, two nearby programmable cells 38 are identified and the programmable cells at those sites are replaced with two programmed cells 38' which replace the functionality previously provided by the standard cell 36. Routing may be provided to and from the programmed cells 38' as required to link into the signals which previously routed to and from the standard cell 36. The inputs of the standard cell 36 will typically be tied off rather than left floating. It will be appreciated from this example that it is advantageous that a high density of programmable cells 10 is achieved in the layout 2 in order to increase the probability that nearby programmable cells 10 will be available when a standard cell 6 needs to be replaced or needs to have its functionality augmented.

The standard cells 6 are used during normal operation of the integrated circuit produced in accordance with the layout of FIG. 3. The programmable cells 10 are typically not used during such normal operation. Programmed cells 38' will be used during operation as they replace or augment the functionality of portions 36 of the integrated circuit. The programmable cells will typically be formed of a plurality of circuit layer patterns and the programmed cells will share a plurality of the circuit layer patterns. This helps reduce the number of masks which need to be altered when programmed cells are to be provided.

Figure 6:
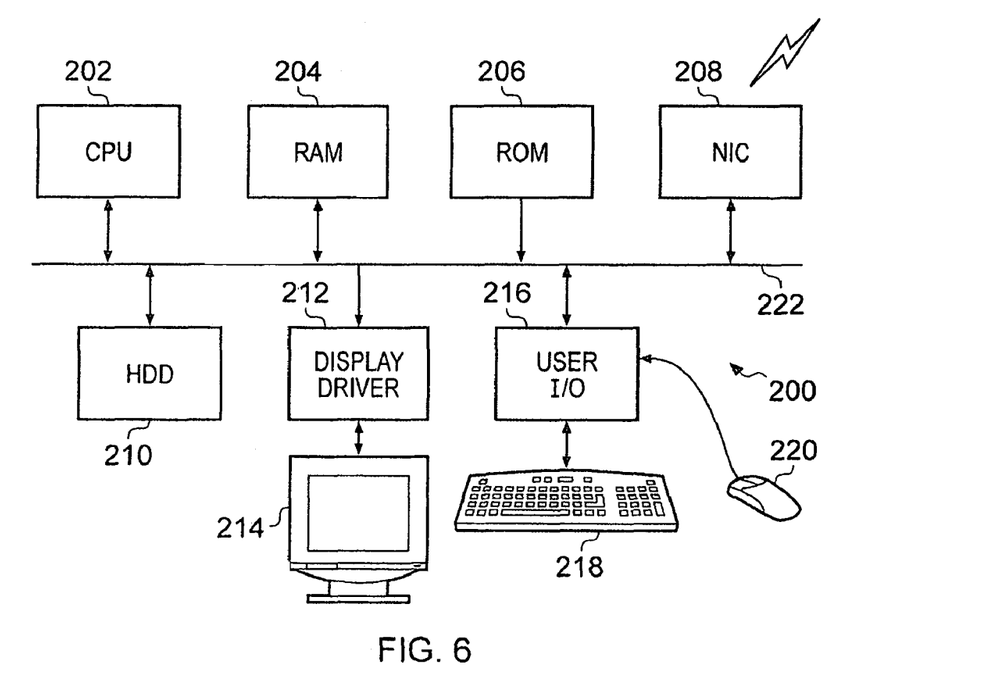
FIG. 6 schematically illustrates a general purpose computer of the type which may be used to implement the above described techniques.

FIG. 6 schematically illustrates a general purpose computer 200 of the type that may be used to implement the above described techniques. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 6 is only one example.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of generating a layout for an integrated circuit, said method comprising the steps of:
   providing an array of standard cell sites for placement of standard cells to be used in forming said integrated circuit;
   placing standard cells at selected standard cell sites within said array;
   searching said array for clusters of adjacent standard cell sites that are not occupied by a standard cell and have a size sufficient to hold a programmable cell, said clusters having boundaries permitted to be at any position within said array and said size corresponding to a plurality of standard cell sites;
   identifying said clusters as programmable sites for programmable cells to be used in forming said integrated circuit and placing programmable cells at said programmable sites; and
   generating layout data characterising said layout, said layout data including site data identifying said programmable sites, said steps are implemented on a computer.

2. A method as claimed in claim 1, comprising placing fill cells at standard cell sites that are not occupied by a standard cell or by a programmable cell.

3. A method as claimed in claim 1, wherein said programmable cells are not used in operation of said integrated circuit and may be modified to form programmed cells that are used in operation of said integrated circuit.

4. A method as claimed in claim 3, wherein a programmable cell is formed of a plurality of circuit layer patterns and a programmed cell shares a plurality of circuit layer patterns with said programmable cell.

5. A method as claimed in claim 4, wherein said programmed cell has one or more metal circuit layers that differ from said programmable cell.

6. A method as claimed in claim 4, wherein said programmed cell has a contact layer that differs from said programmable cell.

7. A computer readable medium storing a computer program for controlling a computer to perform a method as claimed in claim 1.

8. A method of generating a modified layout of an integrated circuit having standard cells aligned with an array of standard cell sites and programmable cells, said method comprising the steps of:
   reading data defining an initial layout of said integrated circuit including site data identifying sites at which programmable cells are located, said programmable cells having a size corresponding to a plurality of standard cell sites and having boundaries permitted to be at any position within said array;
   automatically placing one or more programmed cells at respective sites identified by said site data as currently containing a programmable cell; and
   automatically adding routing connections to couple said one or more programmed cells to one or more standard cells within said integrated circuit, said steps are implemented on a computer.

9. A method as claimed in claim 8, wherein said one or more programmed cells may only be placed at sites identified by said site data as currently containing a programmable cell.

10. A method as claimed in claim 8, wherein before said step of automatically placing, deleting said programmable cells from said programmable sites identified by said site data to provide empty sites in to which programmed cells can be placed.

11. A method as claimed in claim 10, wherein after said step of automatically placing, refilling empty sites identified by said site data and not containing a programmed cell with a programmable cell.

12. A method as claimed in claim 8, wherein said modified layout has fill cells at standard cell sites that are not occupied by a standard cell, a programmable cell or a programmed cell.

13. A method as claimed in claim 8, wherein said programmable cells are not used in operation of said integrated circuit and may be modified to form programmed cells that are used in operation of said integrated circuit.

14. A method as claimed in claim 13, wherein a programmable cell is formed of a plurality of circuit layer patterns and a programmed cell shares a plurality of circuit layer patterns with said programmable cell.

15. A method as claimed in claim 14, wherein said programmed cell has one or more metal circuit layers that differ from said programmable cell.

16. A method as claimed in claim 14, wherein said programmed cell has a contact layer that differs from said programmable cell.

17. A computer readable medium storing a computer program for controlling a computer to perform a method as claimed in claim 8.

* * * * *